(12) United States Patent
Reden et al.

(10) Patent No.: US 7,586,098 B2
(45) Date of Patent: Sep. 8, 2009

(54) ION STRIPPER DEVICE MADE OF CARBON NANOTUBES OR FULLERENES

(75) Inventors: Karl von Reden, Woods Hole, MA (US); Enid Sichel, Woods Hole, MA (US)

(73) Assignee: Woods Hole Oceanographic Institution, Woods Hole, MA (US)

( * ) Notice: Subject to any disclaimer, the term of this patent is extended or adjusted under 35 U.S.C. 154(b) by 563 days.

(21) Appl. No.: 11/189,904

(22) Filed: Jul. 26, 2005

(65) Prior Publication Data

US 2006/0292058 A1    Dec. 28, 2006

Related U.S. Application Data

(60) Provisional application No. 60/591,214, filed on Jul. 26, 2004.

(51) Int. Cl.
*H01J 27/00* (2006.01)

(52) U.S. Cl. ............... 250/423 R; 250/396 ML; 250/423 F; 250/396 R; 423/447.2; 422/186; 422/186.04; 422/186.21; 422/186.22; 422/186.28; 313/336; 313/361.1; 315/105; 315/106; 315/107

(58) Field of Classification Search ............ 250/423 R, 250/396 ML, 423 F, 396 R; 423/447.2; 422/186, 422/186.04, 186.21, 186.22, 186.28; 313/361.1, 313/336; 315/105, 106, 107
See application file for complete search history.

(56) References Cited

U.S. PATENT DOCUMENTS 6,869,574 B2 *   3/2005   Hojoh et al. ............ 422/186

\* cited by examiner

*Primary Examiner*—Jack I Berman
*Assistant Examiner*—Meenakshi S Sahu
(74) *Attorney, Agent, or Firm*—Ropes & Gray LLP

(57) ABSTRACT

A system and method for developing a solid state stripper device is described that more effectively strips off negative carbon ions to produce positively charged carbon ions. In one embodiment the solid state stripping device is a self-supporting aggregate of nanotubes or Buckminster-Fullerenes. Such devices provide, among other things, carbon stripper foil for use in a tandem generator.

10 Claims, 3 Drawing Sheets

ION STRIPPER DEVICE MADE OF CARBON NANOTUBES OR FULLERENES

CROSS-REFERENCE TO RELATED APPLICATIONS

This application claims priority to and benefit of, and incorporates by reference, U.S. Provisional Patent Application No. 60/591,214 filed on Jul. 26, 2004.

BACKGROUND

Charge exchange devices are critical components of tandem accelerator terminals, used widely in accelerator mass spectrometry, ion implantation, and other ion beam applications. These devices require the injection of negative ion beams and charge exchange in the center terminal, from which the positive ions emerge, gaining at least twice the energy of a single stage accelerator with the same terminal voltage (depending on the final charge state). Presently, existing techniques; foil stripping and gas stripping are greatly limited in their respective effectiveness. Foil stripping makes use of thin graphite foils, usually created by laser ablation. These foils are fragile and do not maintain their physical properties during ion bombardment. Their lifetime ranges from a few hours to at most a few days, depending on the ion beam parameters. Gas stripping introduces a degradation of the system beam line vacuum, unless complex differential pumping is employed. The degraded vacuum causes increased "background" events in the measured data. Gas stripping also requires the accelerator to be larger than it would have to be with foil stripping, as a low conductance stripper tube (0.5-1 m long) has to be fitted into the terminal.

Accordingly, there is a need in the art for improved devices, methods and materials for producing charged ions.

SUMMARY

A solid state stripper device is described that more effectively strips off negative carbon ions to produce positively charged carbon ions. The methods and apparatus described herein provide for improved charge exchange in devices including, but not limited to tandem accelerator terminals, ion implantation, and other ion beam devices. In one embodiment the solid state stripping device is a self-supporting aggregate of nanotubes or Buckminster-Fullerenes. Such devices provide, among other things, carbon stripper foil.

In another aspect, the durability of nanotube meshes represent improvements over carbon foil exchange devices, because they effectively conduct away charge and heat from the ion bombardment, while any mechanical impact is limited to a small section of one fiber per ion collision.

In another yet another aspect, nanotube meshes represent improvements over gas stripping exchange devices since there is no need for complex differential pumping, vacuum degradation is eliminated, and there are greatly reduced background events in the measured data.

More specifically, in one aspect, the systems and methods described herein produce a beam of positively charged particles by a means for converting beams of accelerated negatively charged ions to positively charged ions by impinging the negative ion beam on a solid state stripper mesh through which the ion beam passes, losing electrons as it travels, and emerging as a positively charged particle beam. The solid state mesh stripper material may be entangled foil or mesh of single or multiwall carbon nanotubes. Alternatively, the solid state mesh stripper material is a free-standing foil or mesh comprised of entangled carbon nanotubes. The carbon nanotubes may be single-walled carbon nanotubes of grapheme structure or multiwall carbon nanotubes. The diameter of the carbon nanotubes is between 1 nanometer and 50 nanometers and the wall thickness of the carbon nanotube ranges from one atomic layer, about 0.1 nanometers, to several atomic layers.

Optionally, the carbon nanotubes have been purified to remove catalyst residue, amorphous carbon, and non-nanotube-structured carbon particles.

The free-standing carbon nanotube mesh may be in the shape of a two-dimensional foil to be clamped at its edges in a sample holder and placed in an ion beam. Alternatively, the free-standing carbon nanotube mesh may be in the shape of a "wool" plug to be lodged in a tube with the ion beam traveling down the tube and through a carbon nanotube "wool" plug. The solid state mesh stripper material may be composed of a matrix of "Buckyballs" or fullerenes, which are made of a single atomic layer of carbon in a spherical or cage-like geometrical structure. The most common Buckyball structure is $C60$, a truncated icosahedron, but there are many other fullerenes such as $C28$, $C70$, $C84$, $C240$, etc. Optionally and alternatively, the solid state mesh stripper material is composed of Boron Nitride in its hexagonal or grapheme-like structure or any other combination of atoms of atomic mass 1 to 40 amu which form hollow tubes or spherical geometrical structures, of which icosahedrons are an example, on the scale of 1 nanometer to 50 nanometers in diameter.

Still other objects, aspects and embodiments of the invention will be described below and will be apparent to those of skill in the art after reviewing the following detailed description.

BRIEF DESCRIPTION OF THE DRAWINGS

The foregoing and other objects, features and advantages of the present invention will become better understood with reference to the following description, appended claims and accompanying drawings, in which:

DETAILED DESCRIPTION OF THE DRAWINGS

To provide an overall understanding of the invention, certain illustrative embodiments will now be described, including an AMS system having a solid state stripping device including a self-supporting aggregate of nanotubes or Buckminster-Fullerenes. Accelerator Mass Spectrometry (AMS) has been used for a number of important research purposes, including for carbon dating a wide variety of carbon-bearing materials, including small seawater samples collected as part of the World Ocean Circulation Experiment (WOCE). However, although the description below is directed to an AMS system, it will be understood by one of ordinary skill in the art that the nanodevice stripper described herein will have utility for other applications and moreover that the systems and methods described herein can be adapted and modified for other suitable applications, within the field of AMS and outside that field, and that such other additions and modifications will not depart from the scope hereof.

AMS, among other things, is a technique for measuring long-lived radio-nuclides that occur naturally in our environment. An AMS device, similar to the device functionally depicted in FIG. 1, uses a particle accelerator in conjunction with ion sources, large magnets, and detectors to separate out interferences and count single atoms in the presence of $1 \times 10^{15}$ (a thousand million million) stable atoms. Radionuclides are used for a wide variety of dating and tracing applications in the geological and planetary sciences, archaeology, and biomedicine.

Figure 1:
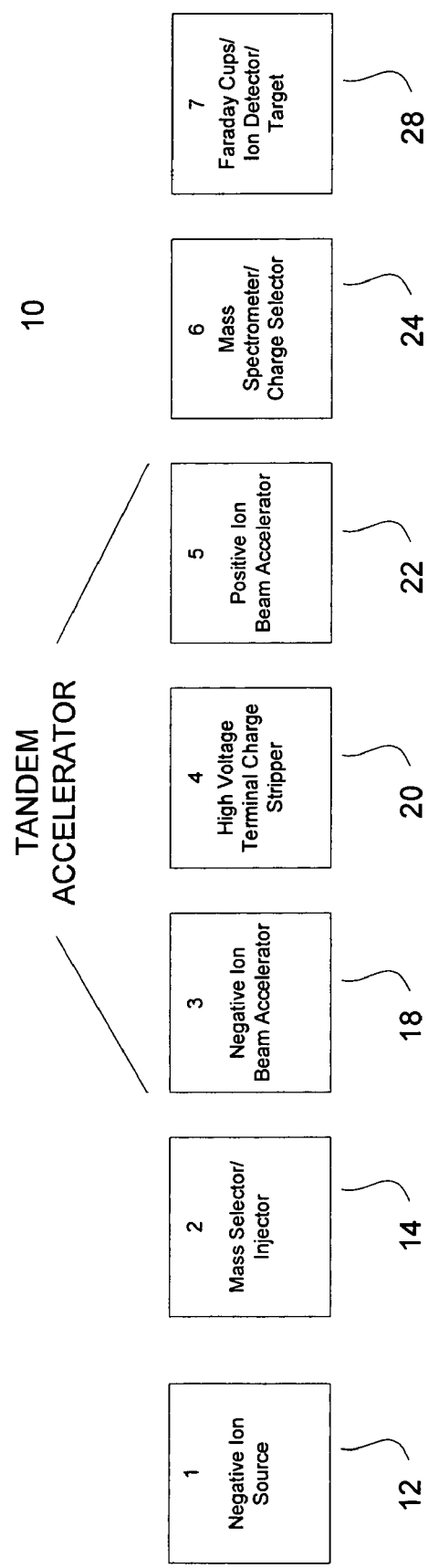
FIG. 1 depicts a typical tandem accelerator arrangements.

In general, the AMS of FIG. 1, as known to those of skill in the art, performs a series of steps. AMS begins with ions starting from atoms that, and being knocked out of the sample material inside the ion source. This atom picks up an electron and becomes a negative ion. It is accelerated away from the ion source by an electrostatic field of many thousands of volts. The ion is then deflected by a large electromagnet through a precise angle that allows it to enter a high voltage accelerator. Only an ion with a specific mass will be deflected through the required angle. Ions of different masses will be lost. Once inside the accelerator, the ion gains energy by attraction to the very high positive voltage at the geometric centre of the pressure vessel. When it arrives at the center region, called the high voltage terminal, some electrons are stripped from the ion, which becomes positive. The ion is then accelerated away by the high positive voltage. This is why this type of accelerator is called a 'tandem' accelerator—it typically has two stages of acceleration, first by pulling and then by pushing the charged particles. On leaving the accelerator, the ion is again deflected by another large electromagnet, this time to filter out the ions that do not have the correct energy or the required positive electrical charge. The ion moves on, usually via another large magnet that deflects it to the required target location where the final analysis is performed.

FIG. 1 is a functional block diagram of typical tandem accelerator arrangement, and it depicts as functional blocks the elements of the AMS system that performs this process. More particularly, FIG. 1 depicts a tandem accelerator 10 having a negative ion source 12, a mass selector/injector 14, a negative ion beam selector 18, a high voltage terminal charge stripper 20, a positive ion beam accelerator 22, a mass spectrometer/charge selector 24 and a faraday cups/ion detector target 28. A negative ion beam is extracted from an ion source 12. Negative ions of the desired mass range are selected in an injector 14, typically made up of electromagnetic and electrostatic bending and focusing devices. The negative ion beam is injected into an electrostatic accelerator column 18 and accelerated toward the high voltage terminal 20, containing a charge stripping device of the type described herein. After passing through the terminal and the stripping device 20 the ions are now at various positive charge states (depending on the stripping efficiency of the charge stripper). The positive ion beam is further accelerated in the second acceleration column 22 and analyzed in the spectrometer 24. Depending on the application, the analyzed ion beam is then directed toward a target or measured in ion detection devices 28.

Figure 2:
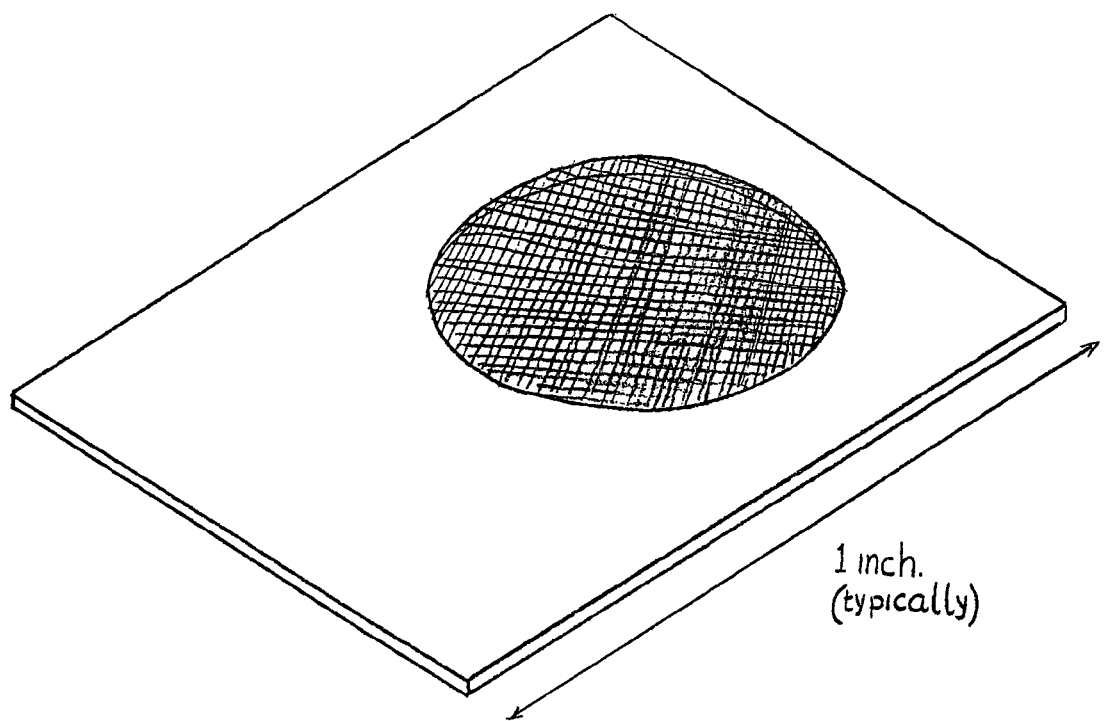
FIG. 2 is a foil holder.

FIG. 2 depicts a foil holder, made of stainless steel or other conducting material compatible with high-vacuum conditions. A self-supporting thin mesh of carbon nanotubes or fullerenes is adhered to the surface across the through hole in the holder. The mesh of nanotubes is expected to be able to easily conduct away the electron current or heat from the charge-exchanging ions. Methods of creating the nanotube mats include matrix-assisted pulsed laser evaporation (MAPLE) and electrospinning. Methods of mounting thin films on sample holders are well known to the thosw skilled in the art.

Figure 3:
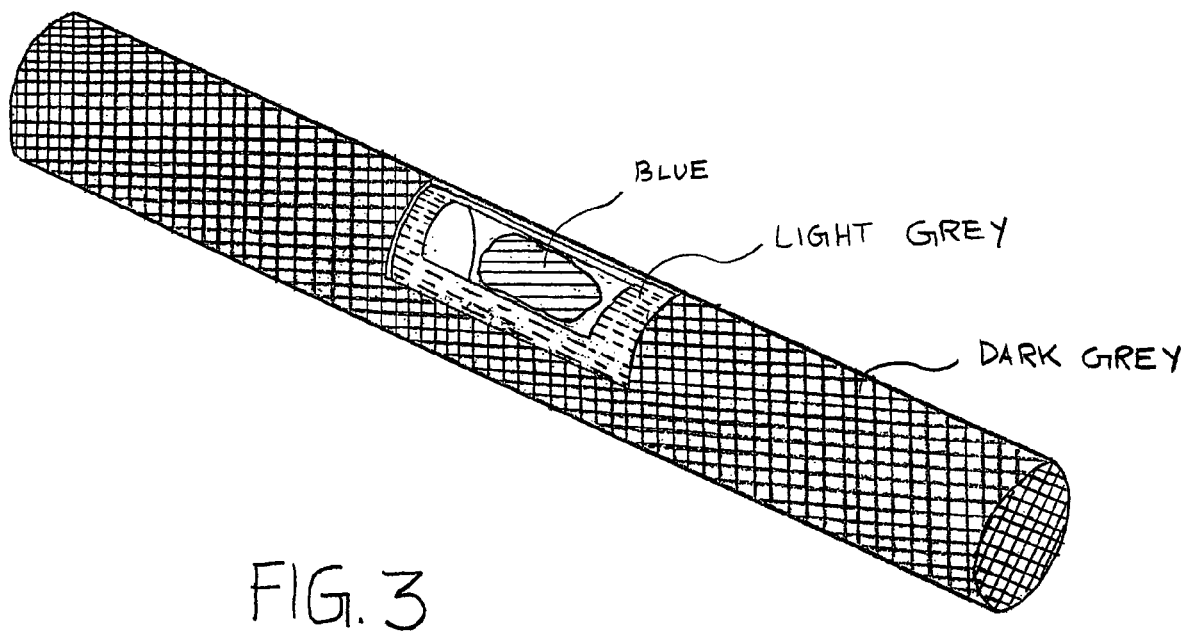
FIG. 3 is a stripper canal insert.

FIG. 3 indicates a tubular member (light grey) inserted into the charge stripper canal (dark grey) of a Tandem accelerator. In this illustration the tubes shown are opened on the side to allow viewing the inside. The insert contains a woolly mesh of carbon nanotubes or fullerenes (blue), held by friction, amounting to 50-100 atomic layers in the cross section. The ends of the insert may have a slight reverse taper to increase friction. This charge stripper will provide an AMS device and method that can have improve longevity and robustness.

It will be understood that the systems and methods described herein are merely examples of the systems and methods of the invention, and that other embodiments, additions and modifications can be made without departing from the scope hereof. For example, although the systems and methods described herein have been discussed with reference to carbon nanotubes, it will be understood that in some applications, other materials such as Boron or other materials may be used. Additionally, although often the case that single-wall nanotubes are employed, in some applications, multi-wall tubes may be used instead of or in combination with single wall structures. Further, although the system has been described as a AMS device, it may be that the devices are realized as tandem generators and/or as stripper material.

Those skilled in the art will know or be able to ascertain using no more than routine experimentation, many equivalents to the embodiments and practices described herein.

Accordingly, it will be understood that the invention is not to be limited to the embodiments disclosed herein, but is to be understood from the following claims, which are to be interpreted as broadly as allowed under the law.

The invention claimed is:

1. A system for producing a beam of positively charged particles, comprising
    means for converting beams of accelerated negatively charged ions to positively charged ions by impinging the negative ion beam on a solid state stripper mesh through which the ion beam passes, losing electrons as it travels, and emerging as a positively charged particle beam.

2. The system of claim 1, wherein such solid state mesh stripper material is entangled foil or mesh of single or multiwall carbon nanotubes.

3. The system of claim 1, wherein said solid state mesh stripper material is a free-standing foil or mesh comprised of entangled carbon nanotubes.

4. The system of claim 2, wherein carbon nanotubes being single-walled carbon nanotubes of grapheme structure or multiwall carbon nanotubes.

5. The system of claim 2, wherein the diameter of the carbon nanotubes is between 1 nanometer and 50 nanometers.

6. The system of claim 2 wherein, the wall thickness of the carbon nanotube ranges from one atomic layer, about 0.1 nanometers, to several atomic layers.

7. The system of claim 2 comprising
    carbon nanotubes having been purified to remove catalyst residue, amorphous carbon, and non-nanotube-structured carbon particles.

8. The system of claim 2 in which the role of the stripper mesh is to strip electrons from the negatively charged ion beam and not to dislodge ions or atoms from the stripper mesh to add to the beam.

9. The system of claim 1, wherein such solid state mesh stripper material is composed of a matrix of "Buckyballs" or fullerenes, which are made of a single atomic layer of carbon in a spherical or cage-like geometrical structure. The most common Buckyball structure is C60, a truncated icosahedron, but there are many other fullerenes such as C28, C70, C84, C240, etc.

10. The system of claim 1, wherein such solid state mesh stripper material is composed of Boron Nitride in its hexagonal or grapheme-like structure or any other combination of atoms of atomic mass 1 to 40 amu which form hollow tubes or spherical geometrical structures, of which icosahedrons are an example, on the scale of 1 nanometer to 50 nanometers in diameter.

* * * * *